(12) United States Patent
Sugita et al.

(10) Patent No.: US 10,199,209 B2
(45) Date of Patent: Feb. 5, 2019

(54) SUBSTRATE TREATMENT APPARATUS AND SUBSTRATE TREATMENT METHOD

(71) Applicant: Toshiba Memory Corporation, Minato-ku (JP)

(72) Inventors: Tomohiko Sugita, Yokkaichi (JP); Katsuhiro Sato, Yokkaichi (JP); Hiroyasu Iimori, Mie (JP); Yoshihiro Ogawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 117 days.

(21) Appl. No.: 14/986,977

(22) Filed: Jan. 4, 2016

(65) Prior Publication Data

US 2016/0365240 A1 Dec. 15, 2016

(30) Foreign Application Priority Data

Jun. 11, 2015 (JP) .................................. 2015-118244

(51) Int. Cl.
*H01L 21/02* (2006.01)
*H01L 21/67* (2006.01)

(52) U.S. Cl.
CPC .. *H01L 21/02052* (2013.01); *H01L 21/67028* (2013.01)

(58) Field of Classification Search
None
See application file for complete search history.

(56) References Cited

U.S. PATENT DOCUMENTS

| 2012/0073599 | A1 | 3/2012 | Miya et al. |
| 2013/0008868 | A1 | 1/2013 | Uozumi et al. |
| 2014/0144465 | A1* | 5/2014 | Kaneko ............. H01L 21/67051 134/4 |
| 2015/0091075 | A1 | 4/2015 | Nishitani et al. |
| 2015/0155159 | A1 | 6/2015 | Igarashi et al. |
| 2015/0221500 | A1 | 8/2015 | Ogihara et al. |
| 2015/0273535 | A1 | 10/2015 | Sato et al. |

(Continued)

FOREIGN PATENT DOCUMENTS

| JP | 2003-133284 A | 5/2003 |
| JP | 2006-303123 A | 11/2006 |

(Continued)

*Primary Examiner* — Eric W Golightly
(74) *Attorney, Agent, or Firm* — Oblon, McClelland, Maier & Neustadt, L.L.P.

(57) ABSTRACT

In one embodiment, a substrate treatment apparatus includes cleaning and rinse modules configured to clean and rinse a surface of a substrate provided with a pattern, and a solidifying agent containing liquid supplying module configured to supply a solidifying agent containing liquid that contains a solidifying agent to the cleaned and rinsed surface of the substrate. The apparatus further includes a precipitation module configured to precipitate the solidifying agent as solid on the surface of the substrate, and a decomposition module configured to decompose and gasify the solid to remove the solid from the surface of the substrate. The solidifying agent contains an ammonium salt, and the ammonium salt contains an ammonium ion or an ion having a structure in which at least one of four hydrogen atoms of an ammonium ion is substituted with another atom or atom group.

6 Claims, 6 Drawing Sheets

(56) References Cited

U.S. PATENT DOCUMENTS

| | | |
|---|---|---|
| 2016/0025410 A1 | 1/2016 | Igarashi et al. |
| 2016/0035595 A1 | 2/2016 | Sato et al. |
| 2016/0141170 A1 | 5/2016 | Sato et al. |
| 2017/0062244 A1 | 3/2017 | Sato et al. |

FOREIGN PATENT DOCUMENTS

| | | |
|---|---|---|
| JP | 2008-10638 | 1/2008 |
| JP | 2012-74564 | 4/2012 |
| JP | 2012-243869 | 12/2012 |
| JP | 2013-16699 | 1/2013 |
| JP | 2013-33817 | 2/2013 |
| JP | 2013-42093 | 2/2013 |
| JP | 2013-42094 | 2/2013 |
| JP | 2013-258272 | 12/2013 |
| JP | 2015-37128 A | 2/2015 |
| JP | 2015-88732 | 5/2015 |
| JP | 2015-106645 | 6/2015 |
| JP | 2015-162486 A | 9/2015 |
| JP | 2015-185713 | 10/2015 |
| JP | 2016-25233 A | 2/2016 |
| JP | 2016-32063 A | 3/2016 |
| JP | 2016-96317 A | 5/2016 |
| JP | 2017-45850 | 3/2017 |

* cited by examiner

| SOLIDIFYING AGENT | DECOMPOSITION TEMPERATURE | DECOMPOSITION PRODUCT | SOLUBILITY |
|---|---|---|---|
| $NH_4Cl$ | 335°C | $NH_3$, HCl | 29.7 g/100 mL (0°C)<br>37.2 g/100 mL (20°C)<br>77.3 g/100 mL (100°C) |
| $NH_4ClO_4$ | 150°C | $Cl_2, N_2, O_2, H_2O$ | 11.56 g/100 mL (0°C)<br>20.85 g/100 mL (20°C)<br>57.01 g/100 mL (100°C) |
| $NH_4ClO_3$ | 102°C | $Cl_2, N_2, O_2, H_2O$ | |
| $(NH_4)_2SO_3$ | 65°C | $SO_2, NH_3, H_2O$ | |
| $(NH_4)_2CO_3$ | 58°C | $CO_2, NH_3, H_2O$ | 55.8 g/100 mL (0°C)<br>10.0 g/100 mL (20°C) |
| $NH_4HCO_3$ | 41.9°C | $CO_2, NH_3, H_2O$ | 11.9 g/100 mL (0°C)<br>21.6 g/100 mL (20°C)<br>36.6 g/100 mL (40°C) |

SUBSTRATE TREATMENT APPARATUS AND SUBSTRATE TREATMENT METHOD

CROSS REFERENCE TO RELATED APPLICATION

This application is based upon and claims the benefit of priority from the prior Japanese Patent Application No. 2015-118244, filed on Jun. 11, 2015, the entire contents of which are incorporated herein by reference.

FIELD

Embodiments described herein relate to a substrate treatment apparatus and a substrate treatment method.

BACKGROUND

After a surface of a substrate is cleaned and rinsed, the surface of the substrate has to be dried. Examples of a substrate drying method include spin drying and isopropyl alcohol (IPA) drying. However, if the surface of the substrate is dried by these substrate drying methods, Laplace pressures caused by surface tension of remaining liquid are applied to patterns on the substrate, and therefore the patterns may collapse. Accordingly, the collapse of the patterns has been prevented by reducing the Laplace pressures by silylating the patterns on the substrate. However, if the patterns on the substrate are formed of a material which cannot be silylated, the silylation cannot be applied.

Therefore, solidification drying has attracted attention as a new substrate drying method. The solidification drying dries the surface of the substrate, for example, by supplying a solidifying agent containing liquid onto the cleaned and rinsed substrate, precipitating the solidifying agent on the substrate, and sublimating the precipitated solidifying agent. However, this case has problems in which handling of a sublimation solidifying agent is difficult, and a decompression chamber for facilitating the sublimation is required.

BRIEF DESCRIPTION OF THE DRAWINGS

FIGS. 1A to 3B are cross-sectional views showing a substrate treatment method of a first embodiment;

DETAILED DESCRIPTION

Embodiments will now be explained with reference to the accompanying drawings.

In one embodiment, a substrate treatment method includes cleaning and rinsing a surface of a substrate provided with a pattern, and supplying a solidifying agent containing liquid that contains a solidifying agent to the cleaned and rinsed surface of the substrate. The method further includes precipitating the solidifying agent as solid on the surface of the substrate, and decomposing and gasifying the solid to remove the solid from the surface of the substrate. Furthermore the solidifying agent contains an ammonium salt, and the ammonium salt contains an ammonium ion or an ion having a structure in which at least one of four hydrogen atoms of an ammonium ion is substituted with another atom or an atom group.

First Embodiment

FIGS. 1A to 3B are cross-sectional views showing a substrate treatment method of a first embodiment.

Figure 1A:
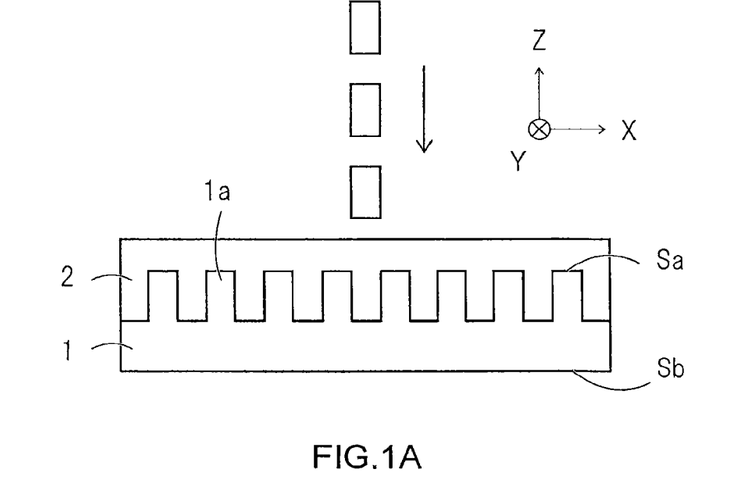

First, the surface of a substrate 1 is cleaned with a cleaning liquid 2 (FIG. 1A). Examples of the cleaning liquid 2 include a sulfuric acid aqueous solution, a hydrogen peroxide aqueous solution, an ammonia aqueous solution and the like. The substrate 1 of the present embodiment has an upper face Sa and a lower face Sb as the surface of the substrate 1, and a plurality of patterns 1a are provided on the upper face Sa of the substrate 1. The upper face Sa is an example of a first face. The lower face Sb is an example of a second face in the opposite side of the first face. In the present process, the cleaning liquid 2 is supplied to the upper face Sa of the substrate 1, and the upper face Sa is cleaned with the cleaning liquid 2.

FIG. 1A shows an X direction and a Y direction which are parallel to the upper face Sa and the lower face Sb of the substrate 1 and are perpendicular to each other, and a Z direction which is perpendicular to the upper face Sa and the lower face Sb of the substrate 1. In the present specification, the +Z direction is considered as an upward direction, and the −Z direction is considered as a downward direction. For example, the positional relation between the substrate 1 and the cleaning liquid 2 is expressed that the cleaning liquid 2 is supplied to the upper face Sa of the substrate 1 from the upper side of the substrate 1. The −Z direction of the present embodiment may match the gravity direction or may not match the gravity direction.

The substrate 1 includes, for example, a semiconductor substrate (semiconductor wafer) and one or more layers formed on the semiconductor substrate. The patterns 1a may be formed in these layers or may be formed in the semiconductor substrate. Examples of the patterns 1a are line patterns which extend in the Y direction and are mutually adjacent in the X direction. Examples of the line patterns are device regions and word lines of a NAND memory.

Figure 1B:
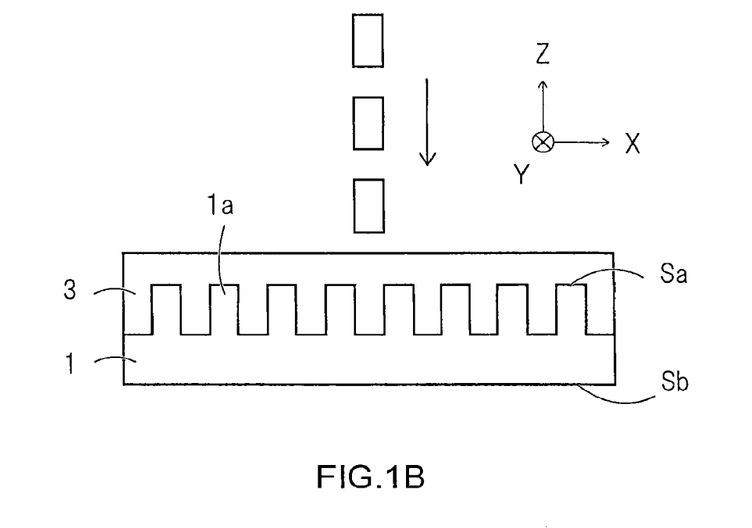

Next, the surface of the substrate 1 is rinsed with a rinse liquid 3 (FIG. 1B). An example of the rinse liquid 3 is warm water. In the present process, the rinse liquid 3 is supplied to the upper face Sa of the substrate 1, and the upper face Sa is rinsed with the rinse liquid 3.

Figure 2A:
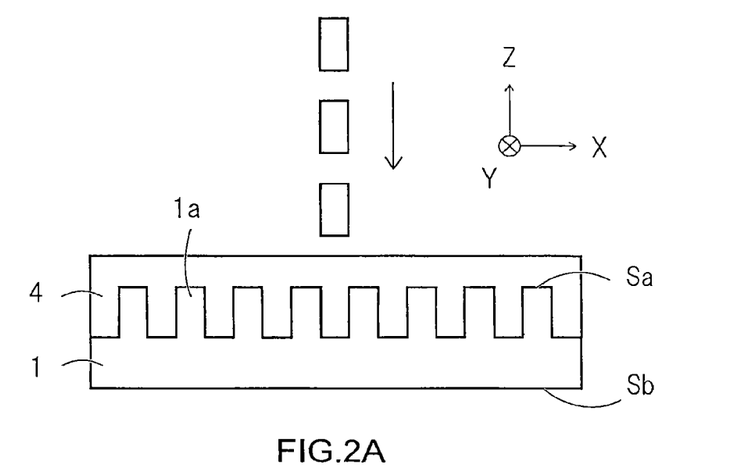

Next, a solidifying agent containing liquid 4 containing a solidifying agent is supplied to the surface of the substrate 1 (FIG. 2A). An example of the solidifying agent containing liquid 4 is warm water in which a solidifying agent is dissolved. In the present process, while the rinse liquid 3 remains on the upper face Sa of the substrate 1, the solidifying agent containing liquid 4 is supplied to the upper face Sa of the substrate 1, thereby substituting the rinse liquid 3 with the solidifying agent containing liquid 4. As a result, the pattern 1a can be prevented from being exposed from liquid and collapsing. Since the solvent of the solidifying agent containing liquid 4 is warm water, the solidifying agent can be prevented from being precipitated (crystallized) during the present process.

The solidifying agent of the present embodiment has a property that it is decomposed and solidified by the action such as heat. Examples of the solidifying agent are ammonium salts such as ammonium carbonate ($(NH_4)_2CO_3$), ammonium hydrogen carbonate ($NH_4HCO_3$), ammonium sulfite ($(NH_4)_2CO_3$), ammonium chlorate ($NH_4ClO_3$), ammonium perchlorate ($NH_4ClO_4$), and ammonium chloride ($NH_4Cl$). These ammonium salts are decomposed and gasified by heat. These ammonium salts are examples of a first salt.

Instead of the ammonium ion ($NH_4^+$), each of these ammonium salts may contain a ion having a structure in which at least one of the four hydrogen atoms of the ammonium ion ($NH_4^+$) is substituted with another atom or an atom group as long as they are within the range in which the property that they are decomposed and gasified by heat can be retained. Examples of such an ion are monofluoro ammonium ion ($NH_3F^+$), difluoro ammonium ion ($NH_2F_2^+$), trifluoro ammonium ion ($NHF_3^+$) and the like. These ammonium salts are examples of a second salt.

Figure 2B:
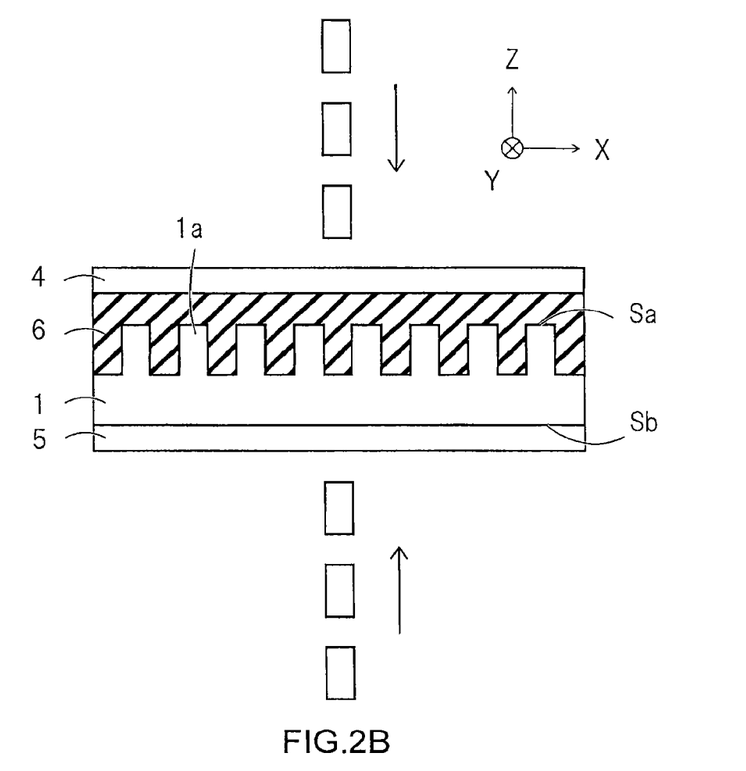

The solidifying agent containing liquid 4 is then cooled by a cooling liquid 5, thereby precipitating the solidifying agent as solid on the surface of the substrate 1 (FIG. 2B). An example of the cooling liquid 5 is cold water. A reference sign "6" represents a precipitate of the solidifying agent. In the present process, the cooling liquid 5 is supplied to the lower face Sb of the substrate 1, thereby cooling the solidifying agent containing liquid 4 of the upper face Sa of the substrate 1 and precipitating the precipitate 6 on the upper face Sa.

The solidifying agent containing liquid 4 may be cooled by a means other than the cooling liquid 5. For example, the solidifying agent containing liquid 4 may be cooled by supplying a cooling gas to the upper face Sa or the lower face Sb of the substrate 1. Examples of the cooling gas are inert gases such as a nitrogen gas and a rare gas. The solidifying agent containing liquid 4 may be cooled by bringing a cooling device or a cooling member into contact with the lower face Sb of the substrate 1. An example of the cooling device or the cooling member is a Peltier device.

The solidifying agent may be precipitated by a method other than cooling. For example, the solidifying agent may be precipitated by adding a substance, which reduces the solubility of the solidifying agent, to the solidifying agent containing liquid 4. An example of such a substance is alcohol. If the solubility of the solidifying agent is reduced when the temperature of the solidifying agent containing liquid 4 is increased, the solidifying agent may be precipitated by heating the solidifying agent containing liquid 4.

In the present embodiment, as shown in FIG. 2B, it is desired to precipitate the solidifying agent so that the precipitate 6 covers upper ends of the patterns 1a. More specifically, it is desired that the patterns 1a be completely covered by the precipitate 6. A reason therefor is that, if the patterns 1a are not completely covered by the precipitate 6 and the upper ends of the patterns 1a are exposed to the solidifying agent containing liquid 4, the patterns 1a may collapse due to the solidifying agent containing liquid 4. However, in order to carry out later-described decomposing treatment in a short period of time, the precipitate amount of the precipitate 6 is desired to be not too large.

Figure 3A:
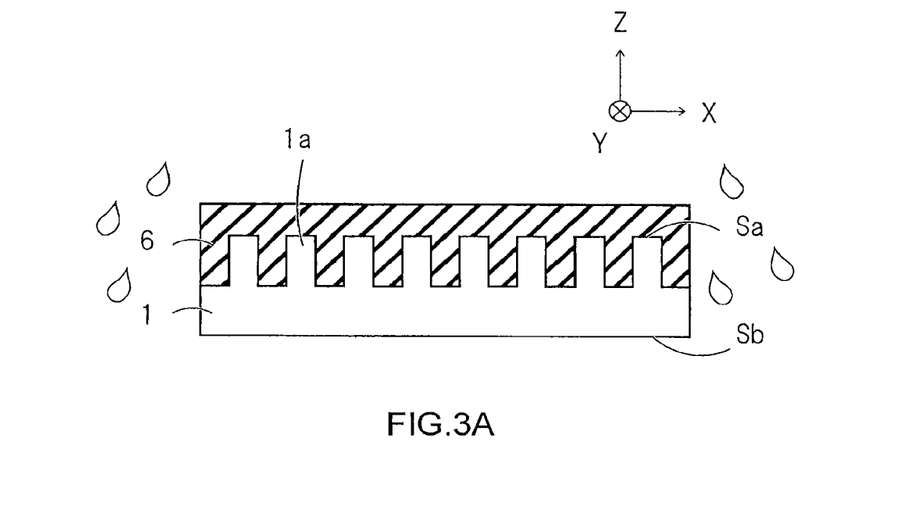
Figure 3B:
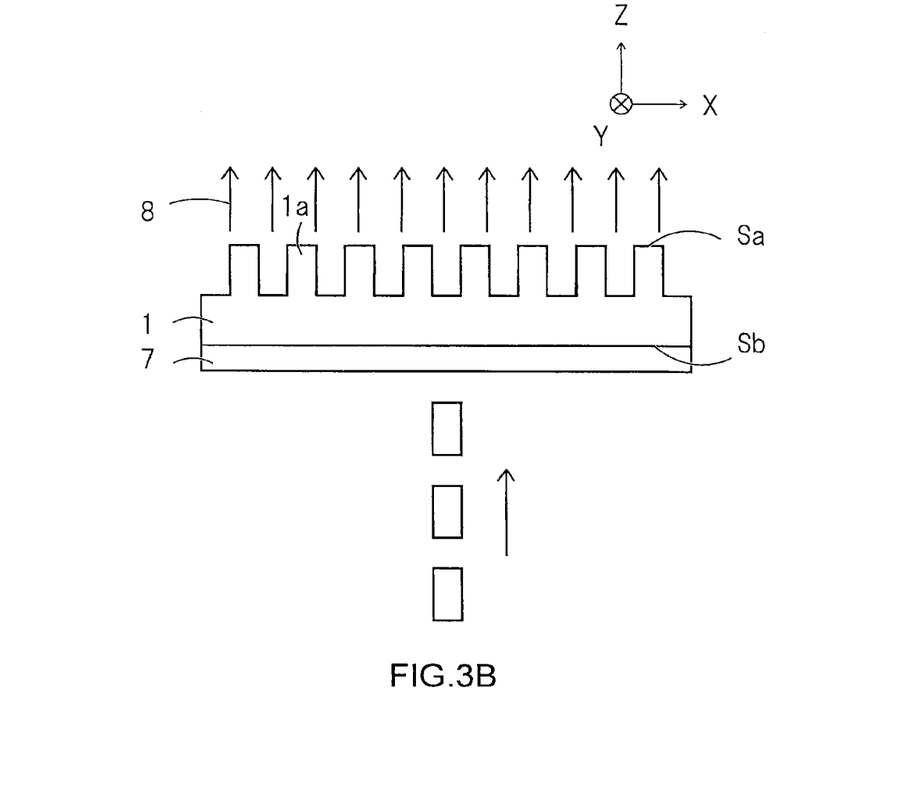

After the precipitation of the solidifying agent, the solidifying agent containing liquid 4 on the substrate 1 is dried (FIG. 3A). In the present process, the substrate 1 may be dried by spin drying, or the substrate 1 may be dried by spraying a gas onto the upper face Sa of the substrate 1. If the processes of FIGS. 1A to 3C are carried out while rotating the substrate 1, it is desired to set the rotating speed of the substrate 1 in spin drying to be higher than the rotating speed of the substrate 1 in other processes.

The precipitate 6 of the solidifying agent is then heated by a heating liquid 7, thereby decomposing and gasifying the precipitate 6 (FIG. 3B). As a result, the precipitate 6 is removed from the surface of the substrate 1. An example of the heating liquid 7 is warm water. A reference sign "8" represents decomposition products generated from the precipitate 6. For example, if the solidifying agent is ammonium hydrogen carbonate, the decomposition products 8 are a carbon dioxide gas, an ammonium gas and water vapor. In the present process, the heating liquid 7 is supplied to the lower face Sb of the substrate 1, thereby heating the precipitate 6 of the upper face Sa of the substrate 1 and decomposing and gasifying the precipitate 6.

The precipitate 6 of the solidifying agent may be heated by a means other than the heating liquid 7. For example, the precipitate 6 may be heated by supplying a heating gas to the upper face Sa or the lower face Sb of the substrate 1. Examples of the heating gas are inert gases such as a nitrogen gas and a rare gas. The precipitate 6 may be heated by bringing a heating device or a heating member into contact with the lower face Sb of the substrate 1. An example of the heating device or the heating member is a resistance heater.

In the present embodiment, the heating liquid 7 having a temperature equal to or higher than the decomposition temperature of the solidifying agent is supplied to the substrate 1, thereby decomposing the precipitate 6 of the solidifying agent. For example, if the solidifying agent is ammonium hydrogen carbonate (decomposition temperature: 41.9° C.), the heating liquid 7 having a temperature of 41.9° C. or higher is supplied. In the present embodiment, in order to facilitate the decomposition of the solidifying agent, it is desired to use a solidifying agent that has a low decomposition temperature. Examples of such a solidifying agent are ammonium carbonate (decomposition temperature: 58° C.), ammonium hydrogen carbonate (decomposition temperature: 41.9° C.), ammonium sulfite (decomposition temperature: 65° C.), etc. Since the decomposition temperatures of these ammonium salts are lower than the boiling point of water (100° C.), the decomposition can be carried out by using warm water as the heating liquid 7.

This is similar also in the case in which the precipitate 6 is heated by a means other than the heating liquid 7. In the case in which the precipitate 6 is heated by the heating gas, the heating gas having a temperature equal to or higher than the decomposition temperature of the solidifying agent is supplied. In the case in which the precipitate 6 is heated by the resistance heater, the temperature of the resistance heater is set to the decomposition temperature of the solidifying agent or higher.

Figure 4:
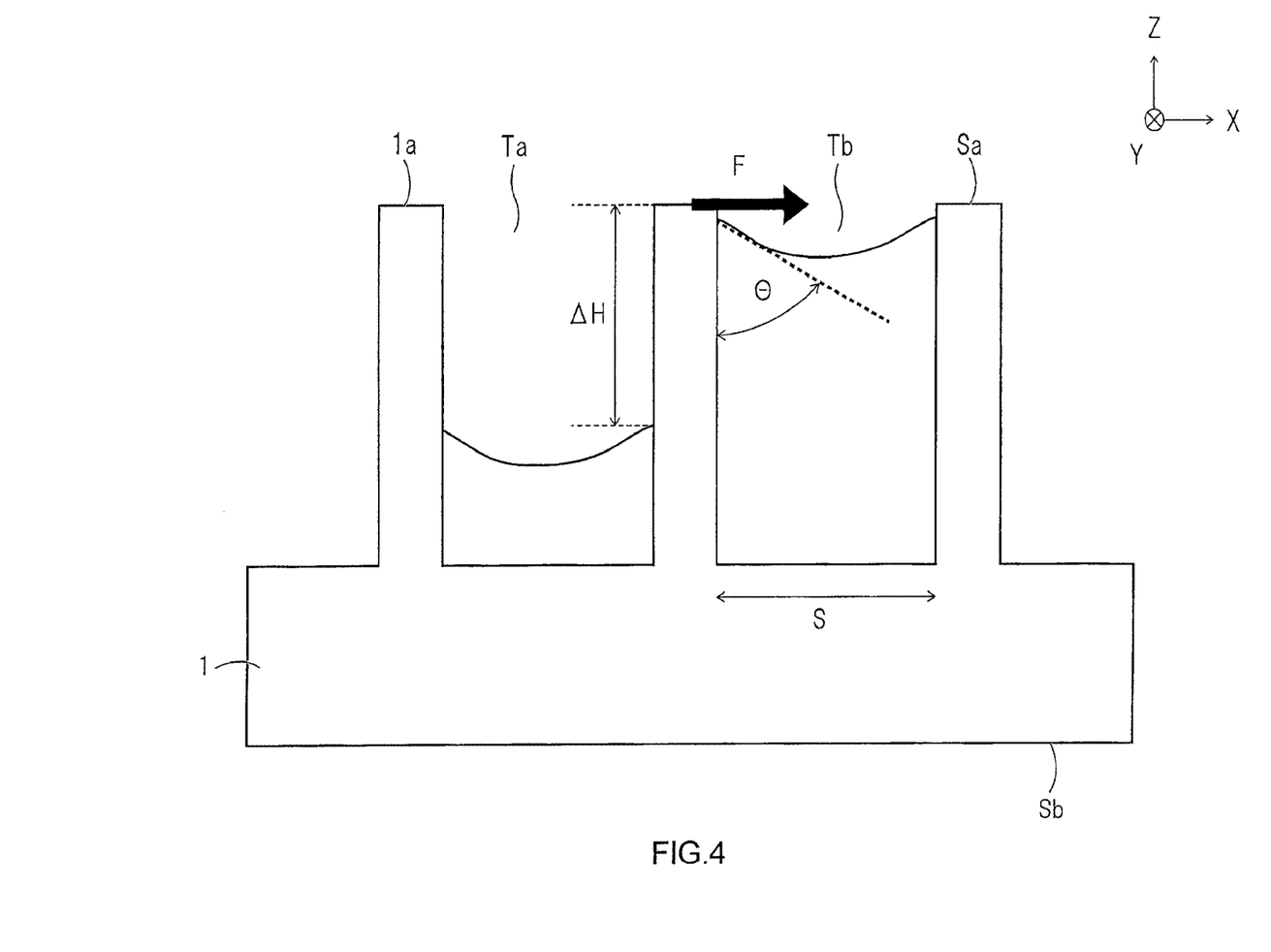
FIG. 4 is a cross-sectional view for explaining Laplace pressures applied to patterns on a substrate.

FIG. 4 is a cross-sectional view for explaining Laplace pressures applied to the patterns 1a on the substrate 1.

Reference signs "Ta" and "Tb" represent spaces (trenches) between the patterns 1a. A small amount of liquid remains in the spaces Ta and Tb. A reference sign "θ" represents a contact angle of the liquid. A reference sign "ΔH" represents the difference between a liquid level in the space Ta and a liquid level in the space Tb. A reference sign "S" represents a space width of the spaces Ta and Tb. If the surface tension of the liquid is represented by γ, the Laplace pressure F applied to the pattern 1a is expressed by a below expression (1).

$$F=\gamma(\cos\theta)\Delta H/S \qquad (1)$$

Generally, when the substrate 1 is to be dried by spin drying or IPA drying, a state in which the spaces Ta and Tb are partially filled with the liquid can be generated as shown in FIG. 4. In this process, since the Laplace pressure F is applied to the pattern 1a, the patterns 1a may collapse. Therefore, if the patterns 1a are silylated, the contact angle θ can be brought closer to 90 degrees, and the Laplace pressure F can be reduced. However, if the patterns 1a are formed of a material which cannot be silylated, the silylation cannot be applied. The Laplace pressure F is inversely proportional to the space width S. Therefore, the more the patterns 1a are miniaturized, the more easily the patterns 1a collapse.

Therefore, in the present embodiment, the substrate 1 is dried by solidification drying. Therefore, according to the present embodiment, the state in which a large Laplace pressure F is applied to the patterns 1a as shown in FIG. 4 can be avoided, and the collapse of the patterns 1a can be prevented.

In the present embodiment, the precipitate 6 of the solidifying agent is gasified by decomposition instead of sublimation. Generally, a sublimation solidifying agent has problems in which handling thereof is difficult since it is an organic substance, and a decompression chamber for facilitating sublimation is required. On the other hand, in the present embodiment, inorganic substances such as ammonium salts which can be easily handled can be used as the solidifying agent, and the solidifying agent can be gasified without the decompression chamber. Therefore, according to the present embodiment, the substrate 1 can be easily dried while preventing collapse of the patterns 1a.

Figure 5:
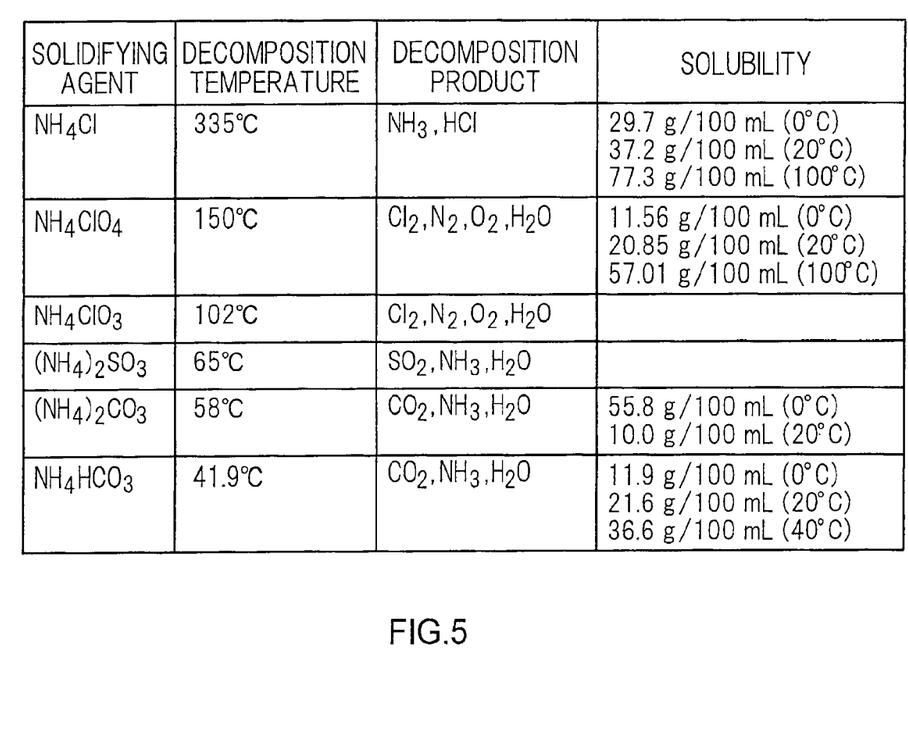
FIG. 5 is a table showing examples of a solidifying agent of the first embodiment.

FIG. 5 is a table showing examples of the solidifying agent of the first embodiment.

FIG. 5 shows decomposition temperatures, decomposition products, and the solubility with respect to water for six types of solidifying agents. These solidifying agents are the above described six types of ammonium salts and are decomposed and gasified by heat. The solubility of ammonium chloride ($NH_4Cl$), ammonium perchlorate ($NH_4ClO_4$), and ammonium hydrogen carbonate ($NH_4HCO_3$) is increased as the temperature of water is increased. Therefore, these solidifying agents can be precipitated by cooling. On the other hand, the solubility of ammonium carbonate (($NH_4)_2CO_3$) is reduced as the temperature of the water is increased. Therefore, these solidifying agents can be precipitated by heating.

As described above, in the present embodiment, the solidifying agent containing liquid 4 is supplied to the surface of the substrate 1, the precipitate 6 of the solidifying agent is precipitated on the surface of the substrate 1, and the precipitate 6 is decomposed and gasified, thereby removing the precipitate 6 from the surface of the substrate 1. Therefore, in the present embodiment, inorganic substances such as ammonium salts which can be easily handled can be used as the solidifying agent, and the solidifying agent can be gasified without a decompression chamber. Therefore, according to the present embodiment, the substrate 1 can be easily dried while preventing the collapse of the patterns 1a on the substrate 1.

Second Embodiment

Figure 6:
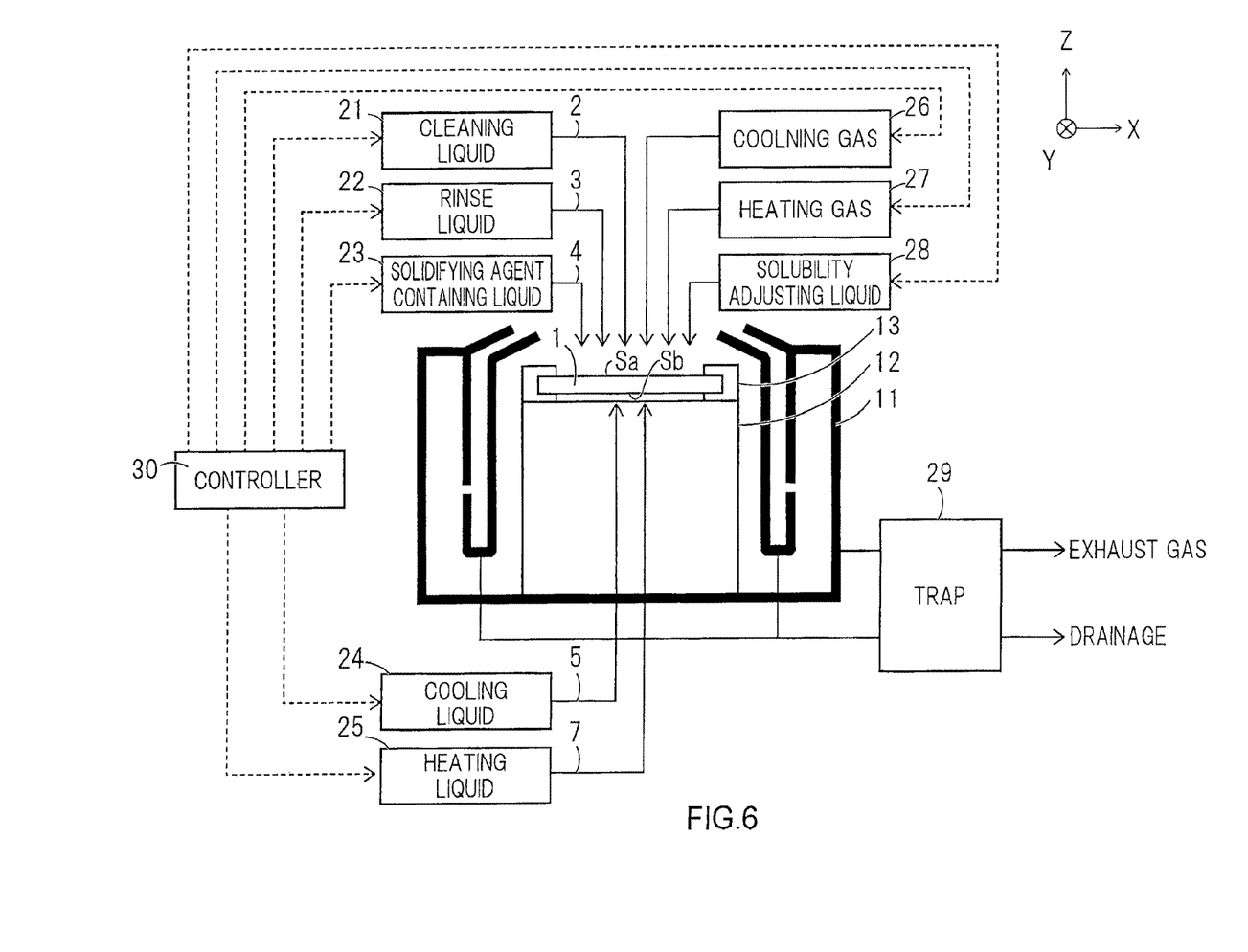
FIG. 6 is a cross-sectional view schematically showing a structure of a substrate treatment apparatus of a second embodiment.

FIG. 6 is a cross-sectional view schematically showing a structure of a substrate treatment apparatus of a second embodiment. The substrate treatment apparatus of the present embodiment is used for executing the substrate treatment method of the first embodiment.

The substrate treatment apparatus of FIG. 6 includes a housing 11, a supporting module 12, a chuck module 13, a cleaning liquid supplying module 21, a rinse liquid supplying module 22, a solidifying agent containing liquid supplying module 23, a cooling liquid supplying module 24, a heating liquid supplying module 25, a cooling gas supplying module 26, a heating gas supplying module 27, a solubility adjusting liquid supplying module 28, a trap module 29, and a controller 30. The cleaning liquid supplying module 21 and a rinse liquid supplying module 22 are examples of cleaning and rinse modules. The cooling liquid supplying module 24, the cooling gas supplying module 26 and the solubility adjusting liquid supplying module 28 are examples of a precipitation module. The heating liquid supplying module 25 and the heating gas supplying module 27 are examples of a decomposition module.

The housing 11 houses the supporting module 12. The supporting module 12 has a chuck module 13 on the upper face thereof. The supporting module 12 can support the substrate 1 by chucking the substrate 1 by the chuck module 13. The supporting module 12 can rotate the substrate 1 in the processes of FIG. 1A to FIG. 3B. The rotating speed of the substrate 1 is controlled by the controller 30.

The cleaning liquid supplying module 21 supplies the cleaning liquid 2 to the upper face Sa of the substrate 1 and cleans the substrate 1 in the process of FIG. 1A. The rinse liquid supplying module 22 supplies the rinse liquid 3 to the upper face Sa of the substrate 1 and rinses the substrate 1 in the process of FIG. 1B. The solidifying agent containing liquid supplying module 23 supplies the solidifying agent containing liquid 4 to the upper face Sa of the substrate 1 and substitutes the rinse liquid 3 with the solidifying agent containing liquid 4 in the process of FIG. 2A. The supply amounts, supply timing, and supply temperatures of the cleaning liquid 2, the rinse liquid 3, and the solidifying agent containing liquid 4 are controlled by the controller 30. The solidifying agent containing liquid 4 of the present embodiment contains the solidifying agent, which is decomposed and gasified by heat.

The cooling liquid supplying module 24 supplies the cooling liquid 5 to the lower face Sb of the substrate 1 in the process of FIG. 2B. As a result, the solidifying agent containing liquid 4 of the upper face Sa of the substrate 1 is cooled, and the precipitate 6 of the solidifying agent is precipitated on the upper face Sa. The cooling liquid 5 of the present embodiment is supplied to the lower face Sb of the substrate 1 in order to prevent mixture with the solidifying agent containing liquid 4. The supply amount, supply timing, and supply temperature of the cooling liquid 5 are controlled by the controller 30.

In the process of FIG. 2B, instead of the cooling liquid supplying module 24, the cooling gas supplying module 26 may be used. The cooling gas supplying module 26 supplies the cooling gas to the upper face Sa or the lower face Sb of the substrate 1 in the process of FIG. 2B. As a result, the solidifying agent containing liquid 4 on the upper face Sa of the substrate 1 is cooled, and the precipitate 6 of the solidifying agent is precipitated on the upper face Sa. Different from the cooling liquid 5, the cooling gas of the present embodiment may be supplied to any one of the upper face Sa and the lower face Sb of the substrate 1. The supply amount, supply timing, and supply temperature of the cooling gas are controlled by the controller 30.

In the process of FIG. 2B, instead of the cooling liquid supplying module 24, the solubility adjusting liquid supplying module 28 may be used. The solubility adjusting liquid supplying module 28 supplies a solubility adjusting liquid to the upper face Sa of the substrate 1 in the process of FIG. 2B. The solubility adjusting liquid contains a substance which reduces the solubility of the solidifying agent in the solidifying agent containing liquid 4. An example of the solubility adjusting liquid is an alcohol aqueous solution. When the solubility adjusting liquid is mixed with the solidifying agent containing liquid 4, the solubility of the solidifying agent is reduced, and the precipitate 6 of the solidifying agent is precipitated on the upper face Sa of the substrate 1. The supply amount, supply timing, and supply temperature of the solubility adjusting liquid are controlled by the controller 30.

The heating liquid supplying module 25 supplies the heating liquid 7 to the lower face Sb of the substrate 1 in the process of FIG. 3B. As a result, the precipitate 6 on the upper face Sa of the substrate 1 is heated, and the precipitate 6 is decomposed and gasified. The heating liquid 7 of the present embodiment is supplied to the lower face Sb of the substrate 1 in order to prevent contact with the precipitate 6. The supply amount, supply timing, and supply temperature of the heating liquid 7 are controlled by the controller 30.

In the process of FIG. 3B, the heating gas supplying module 27 may be used instead of the heating liquid supplying module 25. The heating gas supplying module 27 supplies the heating gas to the upper face Sa or the lower face Sb of the substrate 1 in the process of FIG. 3B. As a result, the precipitate 6 of the upper face Sa of the substrate 1 is heated, and the precipitate 6 is decomposed and gasified. Different from the heating liquid 7, the heating gas of the present embodiment may be supplied to any one of the upper face Sa and the lower face Sb of the substrate 1. The supply amount, supply timing, and supply temperature of the heating gas are controlled by the controller 30.

The substrate treatment apparatus of the present embodiment may include only one or only two of the cooling liquid supplying module 24, the cooling gas supplying module 26 and the solubility adjusting liquid supplying module 28. The substrate treatment apparatus of the present embodiment may include only one of the heating liquid supplying module 25 and the heating gas supplying module 27.

The cleaning liquid 2, the rinse liquid 3, the solidifying agent containing liquid 4, the cooling liquid 5, the heating liquid 7, and the solubility adjusting liquid after use flow into the trap module 29. Furthermore, the cooling gas and the heating gas after use flow into the trap module 29. Furthermore, the solidifying agent and the precipitate 6 thereof contained in the liquid and the decomposition products 8 contained in the gas flow into the trap module 29. The trap module 29 removes the solidifying agent, the precipitate 6, the decomposition products 8 and the like from the liquid and the gas and discharges them as drainage or an exhaust gas.

The controller 30 controls various operations of the substrate treatment apparatus in the above described manner. For example, the controller 30 controls the temperatures of the cooling liquid 5 and the cooling gas by cooling them and controls the temperatures of the heating liquid 7 and the heating gas by heating them. The controller 30 controls the temperatures of the rinse liquid 3 and the solidifying agent containing liquid 4 to high temperatures so that the solidifying agent in the solidifying agent containing liquid 4 is not precipitated before the process of FIG. 2B. For example, if the rinse liquid 3 is water and the solidifying agent containing liquid 4 is an ammonium hydrogen carbonate aqueous solution, the temperatures of the rinse liquid 3 and the solidifying agent containing liquid 4 are desired to be set at 25° C. to 40° C.

As described above, in the present embodiment, the solidifying agent containing liquid 4 is supplied to the surface of the substrate 1, the precipitate 6 of the solidifying agent is precipitated on the surface of the substrate 1, and the precipitate 6 is decomposed and gasified, thereby removing the precipitate 6 from the surface of the substrate 1. Therefore, in the present embodiment, inorganic substances such as ammonium salts which can be easily handled can be used as the solidifying agent, and the solidifying agent can be gasified without a decompression chamber. Therefore, according to the present embodiment, while preventing collapse of the patterns 1a on the substrate 1, the substrate 1 can be easily dried.

In the substrate treatment apparatus of the present embodiment, since the precipitate 6 is gasified by decomposition instead of sublimation, a decompression device for facilitating sublimation is not required to be provided. Therefore, according to the present embodiment, the substrate treatment apparatus having a simple structure without a decompression device can be realized.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
a chuck module configured to chuck a substrate including an upper face on which a pattern is provided;
a supporting module configured to support and rotate the chucked substrate, the chuck module chucking the substrate to provide a space between a lower face of the substrate and an upper face of the supporting module;
cleaning and rinse modules configured to clean and rinse the upper face of the substrate;
a solidifying agent containing liquid supplying module configured to supply a solidifying agent containing liquid that contains a solidifying agent and has a temperature at which the solidifying agent is not precipitated to the cleaned and rinsed upper face of the substrate;
a precipitation module configured to control a temperature of the solidifying agent containing liquid to reduce solubility of the solidifying agent by supplying a fluid to the space, precipitate the solidifying agent as a solid on the upper face of the substrate and remove the solidifying agent containing liquid after the precipitated solidifying agent covers an upper end of the pattern; and
a decomposition module configured to feed a fluid having a temperature higher than a decomposition temperature of the solid to the lower face of the substrate, and to decompose and gasify the solid by heating the substrate with the fluid to remove the solid from the upper face of the substrate, the decomposition module feeding no liquid as the fluid to the upper face of the substrate during the decomposition of the solidifying agent,
wherein
the space works as a heat transport field through the supplied fluid for the precipitation and decomposition of the solidifying agent,
the solidifying agent contains an ammonium salt, and
the ammonium salt contains an ammonium ion or an ion having a structure in which at least one of four hydrogen atoms of an ammonium ion is substituted with another atom or atom group.

2. The apparatus of claim 1, wherein the ammonium salt contains at least one of a first salt and a second salt, the first salt being ammonium carbonate, ammonium hydrogen carbonate, ammonium sulfite, ammonium chlorate, ammonium perchlorate or ammonium chloride, the second salt having a structure in which at least one of four hydrogen atoms of an ammonium ion of the first salt is substituted with another atom or an atom group.

3. The apparatus of claim 1, wherein the solidifying agent containing liquid supplying module supplies the solidifying agent containing liquid to the upper face of the substrate while the rinse liquid remains on the upper face of the substrate.

4. The apparatus of claim 1, wherein the decomposition B module feeds a gas as the fluid to at least the lower face of the substrate.

5. The apparatus of claim 1, wherein the precipitation module precipitates the solidifying agent by supplying a cooling liquid or a cooling gas to the substrate.

6. The apparatus of claim 1, wherein the precipitation module precipitates the solidifying agent by adding a substance that reduces solubility of the solidifying agent to the solidifying agent containing liquid.

* * * * *